(12) United States Patent
Fang et al.

(10) Patent No.: US 11,741,880 B2
(45) Date of Patent: Aug. 29, 2023

(54) DRIVING METHOD, DRIVING CIRCUITRY AND DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Zhixiang Fang, Beijing (CN); Liangliang Zheng, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 189 days.

(21) Appl. No.: 17/413,362

(22) PCT Filed: Sep. 2, 2020

(86) PCT No.: PCT/CN2020/113044
§ 371 (c)(1),
(2) Date: Jun. 11, 2021

(87) PCT Pub. No.: WO2022/047672
PCT Pub. Date: Mar. 10, 2022

(65) Prior Publication Data
US 2022/0319387 A1    Oct. 6, 2022

(51) Int. Cl.
*G09G 3/20* (2006.01)
*G06F 3/041* (2006.01)
*G11C 19/28* (2006.01)

(52) U.S. Cl.
CPC ......... *G09G 3/2092* (2013.01); *G06F 3/0412* (2013.01); *G06F 3/04166* (2019.05);
(Continued)

(58) Field of Classification Search
CPC ......... G09G 3/2092; G09G 2310/0286; G09G 2310/08; G09G 2354/00; G06F 3/0412;
(Continued)

(56) References Cited

U.S. PATENT DOCUMENTS 10,768,744 B2 * 9/2020 Chang .................. G06F 3/0416
10,825,373 B1 * 11/2020 Shepelev ............. G09G 3/3266
(Continued)

FOREIGN PATENT DOCUMENTS

CN    207082321 U    3/2018
CN    108062938 A    5/2018
(Continued)

OTHER PUBLICATIONS

First Office Action for Chinese Application No. 202080001783.9, dated Nov. 2, 2022, 10 Pages.

*Primary Examiner* — Jose R Soto Lopez
(74) *Attorney, Agent, or Firm* — BROOKS KUSHMAN P.C.

(57) ABSTRACT

A driving method, a driving circuitry and a display device are provided. The driving method is applied to a touch display panel. A shift register unit in a gate driving circuitry in the touch display panel is electrically coupled with a clock signal terminal, the clock signal terminal is used for providing a clock signal to a pull-up circuit in the shift register unit, and a display cycle includes a display time period and a touch time period. The driving method includes: within a period during which initial N rows of gate lines are turned on after entering the display time period from the touch time period in the display cycle, controlling and adjusting the clock signal to increase a falling speed of a potential of a gate drive signal outputted by the shift register unit; N is a positive integer. The phenomenon of poor horizontal stripes is improved.

19 Claims, 9 Drawing Sheets

(52) U.S. Cl.
CPC . *G09G 2310/0286* (2013.01); *G09G 2310/08* (2013.01); *G11C 19/28* (2013.01)

(58) Field of Classification Search
CPC .. G06F 3/04166; G06F 3/04184; G11C 19/28
See application file for complete search history.

(56) References Cited

U.S. PATENT DOCUMENTS

| | | | | |
|---|---|---|---|---|
| 2007/0195920 | A1* | 8/2007 | Tobita | G11C 19/28 377/64 |
| 2007/0262310 | A1* | 11/2007 | Park | G09G 3/3659 257/59 |
| 2008/0309633 | A1* | 12/2008 | Hotelling | G06F 3/0412 345/173 |
| 2009/0102779 | A1* | 4/2009 | Jo | G09G 3/3696 345/204 |
| 2015/0262528 | A1* | 9/2015 | Takahara | G09G 3/3258 345/212 |
| 2016/0179275 | A1* | 6/2016 | Lee | G06F 3/04166 345/174 |
| 2017/0108970 | A1* | 4/2017 | Kim | G06F 3/0446 |
| 2017/0185194 | A1* | 6/2017 | Kim | G09G 3/3677 |
| 2017/0287425 | A1* | 10/2017 | Koo | G09G 5/18 |
| 2017/0344179 | A1* | 11/2017 | Kim | G06F 3/0443 |
| 2018/0004329 | A1* | 1/2018 | So | G09G 3/3648 |
| 2018/0012533 | A1* | 1/2018 | Lee | G09G 3/2092 |
| 2018/0121023 | A1* | 5/2018 | Kim | G09G 3/3677 |
| 2018/0190364 | A1* | 7/2018 | Gu | G09G 3/3674 |
| 2018/0286490 | A1* | 10/2018 | Sun | G09G 5/10 |
| 2019/0156778 | A1* | 5/2019 | Li | G11C 19/28 |
| 2019/0204981 | A1* | 7/2019 | Lee | G06F 3/0412 |
| 2020/0020280 | A1* | 1/2020 | Han | G09G 3/3266 |
| 2020/0058362 | A1* | 2/2020 | Xu | G09G 3/20 |
| 2020/0312262 | A1* | 10/2020 | Koo | G09G 3/3674 |
| 2020/0371626 | A1* | 11/2020 | Mugiraneza | G02F 1/13338 |
| 2021/0020137 | A1* | 1/2021 | Jang | G09G 3/3688 |
| 2021/0027734 | A1* | 1/2021 | Shan | G11C 19/28 |
| 2021/0158744 | A1* | 5/2021 | Kang | G09G 3/2092 |
| 2021/0216187 | A1* | 7/2021 | Fang | G06F 3/04184 |
| 2021/0373732 | A1* | 12/2021 | Tian | G06F 3/04166 |
| 2022/0208058 | A1* | 6/2022 | Hwang | G09G 3/3233 |
| 2022/0208105 | A1* | 6/2022 | Lee | G09G 3/3266 |

FOREIGN PATENT DOCUMENTS

| | | |
|---|---|---|
| CN | 108399884 A | 8/2018 |
| CN | 108519838 A | 9/2018 |
| CN | 108806634 A | 11/2018 |
| CN | 109243356 A | 1/2019 |
| CN | 111583880 A | 8/2020 |

* cited by examiner

DRIVING METHOD, DRIVING CIRCUITRY AND DISPLAY DEVICE

CROSS-REFERENCE TO RELATED APPLICATION

This application is the U.S. national phase of PCT Application No. PCT/CN2020/113044 filed on Sep. 2, 2020, which is incorporated herein by reference in its entirety.

TECHNICAL FIELD

The present disclosure relates to the field of touch display technologies, and in particular to a driving method, a driving circuitry and a display device.

BACKGROUND

A related TDDI (Touch and Display Driver Integration) panel works in column inversion mode, and may enters a touch state from a display state in 120 Hz Report Rate (report rate) Long (long) H Blank (blank) mode. When the panel returns to the display state after completing touch scan, the panel may generate a horizontal stripe after pits occur (the number of pits is determined by the number of touch scans, generally more than 10, which is related to a driving mode of an actual product), which is generally dark stripe.

SUMMARY

In one aspect, an embodiment of the present disclosure provides a driving method, which is applied to a touch display panel. A shift register unit included in a gate driving circuitry in the touch display panel is electrically coupled with a clock signal terminal, the clock signal terminal is used for providing a clock signal to a pull-up circuit in the shift register unit, a display cycle includes a display time period and a touch time period that are alternately set, and the driving method includes:

within a period during which initial N rows of gate lines are turned on after entering the display time period from the touch time period in the display cycle, controlling and adjusting the clock signal to increase a falling speed of a potential of a gate drive signal outputted by the shift register unit; N is a positive integer.

Optionally, a potential of the clock signal is switched between a low potential and a high potential, the high potential is higher than the low potential, and the controlling and adjusting the clock signal includes:

when the potential of the clock signal is the low potential, decreasing the potential of the clock signal from a first low potential to a second low potential.

Optionally, the driving method further includes: after the period during which the N rows of gate lines are turned on has lapsed after entering the display time period from the touch time period in the display cycle, and when the potential of the clock signal is the low potential, controlling the potential of the clock signal to be restored from the second low potential to the first low potential.

Optionally, a potential of the clock signal is switched between a low potential and a high potential, the high potential is higher than the low potential, and the controlling and adjusting the clock signal includes:

when the potential of the clock signal is the high potential, increasing the potential of the clock signal from a first high potential to a second high potential.

Optionally, the driving method further includes: after the period during which the N rows of gate lines are turned on has lapsed after entering the display time period from the touch time period in the display cycle, and when the potential of the clock signal is the high potential, controlling the potential of the clock signal to be restored from the second high potential to the first high potential.

Optionally, a potential of the clock signal is switched between a low potential and a high potential, and the high potential is higher than the low potential; the clock signal terminal is electrically coupled with a voltage control terminal via a switch control circuit, and the switch control circuit is configured to control the voltage control terminal to provide a low voltage signal to the clock signal terminal; and the controlling and adjusting the clock signal includes:

when the switch control circuit controls the voltage control terminal to provide the low voltage signal to the clock signal terminal, decreasing a resistance value of the switch control circuit from a first resistance value to a second resistance value.

Optionally, the driving method further includes: after the period during which the N rows of gate lines are turned on has lapsed after entering the display time period from the touch time period in the display cycle, and when the switch control circuit controls the voltage control terminal to provide the low voltage signal to the clock signal terminal, restoring the resistance value of the switch control circuit from the second resistance value to the first resistance value.

Optionally, within the period during which the initial N rows of gate lines are turned on after entering the display time period from the touch time period in the display cycle, the controlling and adjusting the clock signal includes: in the display cycle, when entering the display time period from the touch time period, setting a count value to 0;

after entering the display time period from the touch time period, increasing the count value by 1, each time when a period during which one of the N rows of gate lines is turned on has elapsed; and when the count value is less than or equal to N, controlling and adjusting the clock signal.

Optionally, N is greater than or equal to 2, and is less than or equal to 10.

The present disclosure further provides a driving circuitry, which is applied to a touch display panel. A shift register unit included in a gate driving circuitry in the touch display panel is electrically coupled with a clock signal terminal, the clock signal terminal is used for providing a clock signal to a pull-up circuit in the shift register unit, a display cycle includes a display time period and a touch time period that are alternately set, and the driving circuitry includes:

a clock signal adjusting circuit configured to: within a period during which initial N rows of gate lines are turned on after entering the display time period from the touch time period in the display cycle, control and adjust the clock signal to increase a falling speed of a potential of a gate drive signal outputted by the shift register unit; N is a positive integer.

Optionally, a potential of the clock signal is switched between a low potential and a high potential, and the high potential is higher than the low potential; and the clock signal adjusting circuit is specifically configured to: decrease the potential of the clock signal from a first low potential to a second low potential, within the period during which the initial N rows of gate lines are turned on after entering the display time period from the touch time period in the display cycle, when the potential of the clock signal is a low potential.

Optionally, the clock signal adjusting circuit is further configured to: control the potential of the clock signal to be restored from the second low potential to the first low potential, after the period during which the N rows of gate lines are turned on has lapsed after entering the display time period from the touch time period in the display cycle, and when the potential of the clock signal is the low potential.

Optionally, a potential of the clock signal is switched between a low potential and a high potential, and the high potential is higher than the low potential; and the clock signal adjusting circuit is specifically configured to increase the potential of the clock signal from a first high potential to a second high potential, within the period during which the initial N rows of gate lines are turned on after entering the display time period from the touch time period in the display cycle, when the potential of the clock signal is the high potential.

Optionally, the clock signal adjusting circuit is further configured to control the potential of the clock signal to be restored from the second high potential to the first high potential, after the period during which the N rows of gate lines are turned on has lapsed after entering the display time period from the touch time period in the display cycle, and when the potential of the clock signal is the high potential.

Optionally, a potential of the clock signal is switched between a low potential and a high potential, and the high potential is higher than the low potential; the driving circuitry further includes a switch control circuit; the clock signal terminal is electrically coupled with a voltage control terminal via the switch control circuit, and the switch control circuit is configured to control the voltage control terminal to provide a low voltage signal to the clock signal terminal; and the clock signal adjusting circuit is specifically configured to decrease a resistance value of the switch control circuit from a first resistance value to a second resistance value, within the period during which the initial N rows of gate lines are turned on after entering the display time period from the touch time period in the display cycle, when the switch control circuit controls the voltage control terminal to provide the low voltage signal to the clock signal terminal.

Optionally, the clock signal adjusting circuit is further configured to restore the resistance value of the switch control circuit from the second resistance value to the first resistance value, after the period during which the N rows of gate lines are turned on has elapsed after entering the display time period from the touch time period in the display cycle, and when the switch control circuit controls the voltage control terminal to provide the low voltage signal to the clock signal terminal.

Optionally, the switch control circuit includes M switch control transistors, M being greater than 1;

a control electrode of an m-th switch control transistor is electrically coupled with an m-th switch control terminal, a first electrode of the m-th switch control transistor is electrically coupled with the clock signal terminal, and a second electrode of the m-th switch control transistor is electrically coupled with the voltage control terminal; m is a positive integer less than or equal to M; and the clock signal adjusting circuit is configured to control at least two of the M switch control transistors to be turned on, within the period during which the initial N rows of gate lines are turned on after entering the display time period from the touch time period in the display cycle, when the switch control circuit controls the voltage control terminal to provide the low voltage signal to the clock signal terminal.

Optionally, the clock signal adjusting circuit is further configured to: control a switch control transistor of the M switch control transistors to be turned on, and other switch control transistors among the M switch control transistors except the switch control transistor to be turned off, after the period during which the N rows of gate lines are turned on has elapsed after entering the display time period from the touch time period in the display cycle, and when the switch control circuit controls the voltage control terminal to provide the low voltage signal to the clock signal terminal.

Optionally, N is greater than or equal to 2, and is less than or equal to 10.

The present disclosure also provides a display device including the above-mentioned driving circuitry.

DETAILED DESCRIPTION

Figure 1:
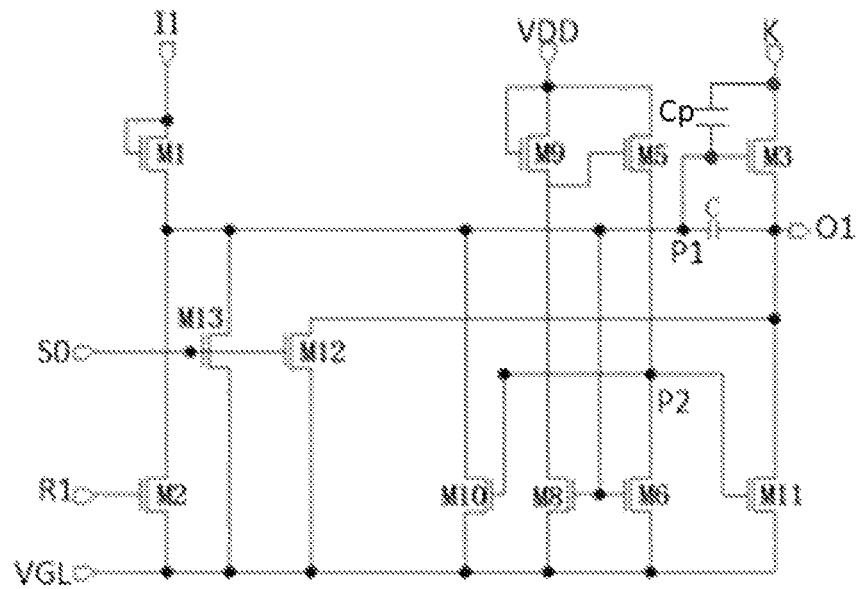
FIG. 1 is a circuit diagram of a shift register unit in a gate driving circuitry according to at least one embodiment.

The technical solution in embodiments of the present disclosure will be clearly and completely described below in conjunction with the accompanying drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative work shall fall within the protection scope of the present disclosure.

Transistors used in all the embodiments of the present disclosure may be triodes, thin film transistors, field effect transistors or other devices with the same characteristics. In the embodiments of the present disclosure, in order to distinguish the two electrodes of a transistor other than a control electrode, one of the electrodes is referred to as a first electrode, and the other electrode is referred to as a second electrode.

In actual operation, in a case that a transistor is a triode, the control electrode may be a base electrode, the first electrode may be a collector electrode, and the second electrode may be an emitter electrode; or, the control electrode may be a base electrode, the first electrode may be an emitter electrode, and the second electrode may be a collector electrode.

In actual operation, in a case that a transistor is a thin film transistor or a field effect transistor, the control electrode may be a gate electrode, the first electrode may be a drain electrode, and the second electrode may be a source electrode; or the control electrode may be a gate electrode, the first electrode may be a source electrode, and the second electrode may be a drain electrode.

A driving method is provided according to at least one embodiment of the present disclosure, which is applied to a touch display panel. A shift register unit included in a gate driving circuitry in the touch display panel is electrically coupled with a clock signal terminal, the clock signal terminal is used for providing a clock signal to a pull-up circuit in the shift register unit, a display cycle includes a display time period and a touch time period that are alternately set, and the driving method includes:

in the display cycle, in a period during which initial N rows of gate lines are turned on after entering the display time period from the touch time period, controlling and adjusting the clock signal to increase a falling speed of a potential of a gate drive signal outputted by the shift register unit, N being a positive integer.

In the at least one embodiment of the present disclosure, the falling speed of a falling edge of the gate drive signal is dynamically enhanced after pits occur (the pits occur when entering the display time period from the touch time period) to prevent a signal mischarging, thereby solving a wrong charging problem caused by that the falling speed of the falling edge of the gate drive signal becomes slower, so as to improve undesirable phenomena of pit-like horizontal stripes.

In at least one embodiment of the present disclosure, during the touch time period, the touch display panel is in a touch controlling state, and the touch display panel performs touch scanning and touch detection; and during the display time period, the touch display panel is in a display state, and the touch display panel performs display.

In at least one embodiment of the present disclosure, the touch display panel may perform touch controlling and displaying alternately in a time division manner, that is, the touch time period and the display time period may be set alternately at intervals.

As shown in FIG. 1, a shift register unit in the gate driving circuitry may include a first transistor M1, a second transistor M2, a third transistor M3, a fourth transistor M4, a fifth transistor M5, a sixth transistor M6, a seventh transistor M7, an eighth transistor M8, a ninth transistor M9, a tenth transistor M10, an eleventh transistor M11, a twelfth transistor M12, a thirteenth transistor M13, a storage capacitor C, and a parasitic capacitor Cp between a gate electrode of M3 and a source electrode of M3.

In FIG. 1, a terminal labeled I1 is an input terminal, a terminal labeled S0 is an initial voltage terminal, a terminal labeled R1 is a reset terminal, a terminal labeled VDD is a power voltage terminal, and a terminal labeled VGL is a low voltage terminal. The clock signal is labeled K, a gate drive signal output terminal is labeled O1, a pull-up node is labeled P1, and a pull-down node is labeled P2.

In the at least one embodiment shown in FIG. 1, all the transistors may be n-type thin film transistors, but they are not limited thereto.

In the related art, the gate driving circuitry may be coupled with 8 clock signals, and the gate driving circuitry needs to use 8 clock signals to complete all the driving. A gate drive signal of the first row is used as an input signal of a shift register unit of the fifth row. A gate drive signal of the fifth row is used as a reset signal of a shift register unit of the first row, and so on, to complete the row-by-row display function of multiple rows of pixel circuits on the display panel. The present disclosure is not limited thereto.

Figure 2:
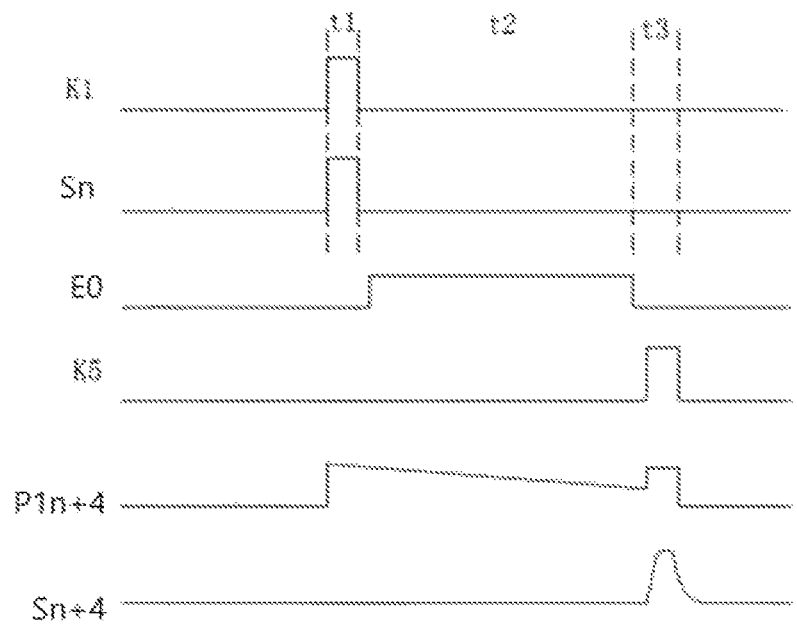
FIG. 2 is a working sequence diagram of a related n-th stage shift register unit.

In the related art, the touch display panel alternately performs touch control and display in a time division manner, that is, performs touch scanning and touch detection during a touch time period. It is assumed that the n-th stage shift register unit uses a first clock signal, and the (n+4)-th stage shift register unit uses a fifth clock signal, n being a positive integer. As shown in FIG. 2, when a potential of a gate drive signal Sn of the n-th row outputted by the n-th stage shift register unit becomes an effective potential, the touch display panel enters a display time period. During a first stage t1, the first clock signal K1 adopted by the n-th stage shift register unit is at a high voltage, Sn used as the input signal of the (n+4)-th stage shift register unit enables M1 in the (n+4)-th stage shift register unit to be turned on, and the potential of the pull-up node P1n+4 in the (n+4)-th stage shift register unit is charged to a high voltage. At this time, since a potential of the fifth clock signal K5 adopted by the (n+4)-th stage shift register unit is at a low voltage, the (n+4)-th stage shift register unit has no output. During a second stage t2 after the first stage t1, the touch time period is entered, potentials of all the clock signals used by the gate driving circuitry are low voltages. Due to the leakage characteristics of transistors, a leakage current may be I1 (the leakage current may be a leakage current between a source electrode and a drain electrode), the leakage amount Q is equal to the product of I1 and the time T, and the leakage amount Q may change as the time T becomes longer. Therefore, the potential of the pull-up node P1n+4 in the (n+4)-th stage shift register unit may drop due to the long-term leakage of the transistor during the touch time period. The display time period is switched after the touch time period ends. In a third stage t3, the potential of the fifth clock signal K5 adopted by the (n+4)-th shift register unit is a high voltage. At this time, although the potential of the pull-up node P1n+4 in the (n+4)-th shift register unit may be pulled up due to bootstrapping under the influence of K5, the potential of P1n+4 may still be lower than a voltage when there is no leakage, which may cause the output waveform of the (n+4)-th stage shift register unit to be deformed, and causes a serious delay of a falling edge of a gate drive signal Sn+4 of the (n+4)-th row outputted by the (n+4)-th stage shift register unit. As a consequence, a transistor in the pixel circuit of the (n+4)-th row in the touch display panel whose gate electrode is coupled with Sn+4 cannot be turned off in time, and may be charged incorrectly, so that defects of horizontal stripes are displayed, which show as dark stripes as the pixel circuit is insufficiently charged. Generally, high temperature reliability may aggravate this phenomenon. Based on this, in the at least one embodiment of the present disclosure, falling speeds of falling edges of several gate drive signals are dynamically enhanced after pits occur to prevent a signal mischarging, thereby solving an incorrect charging problem due to a slower falling speed of the falling edge of the gate drive signal, which is caused by that the transistor(s) is not sufficiently turned on, and a state where there is no pit is automatically restored after several rows are scanned.

In FIG. 2, a touch enable signal is labeled E0. When E0 is at a high voltage, the touch display panel is in a touch state, and when E0 is at a low voltage, the touch display panel is in a display state. However, the present disclosure is not limited to thereto.

Figure 3:
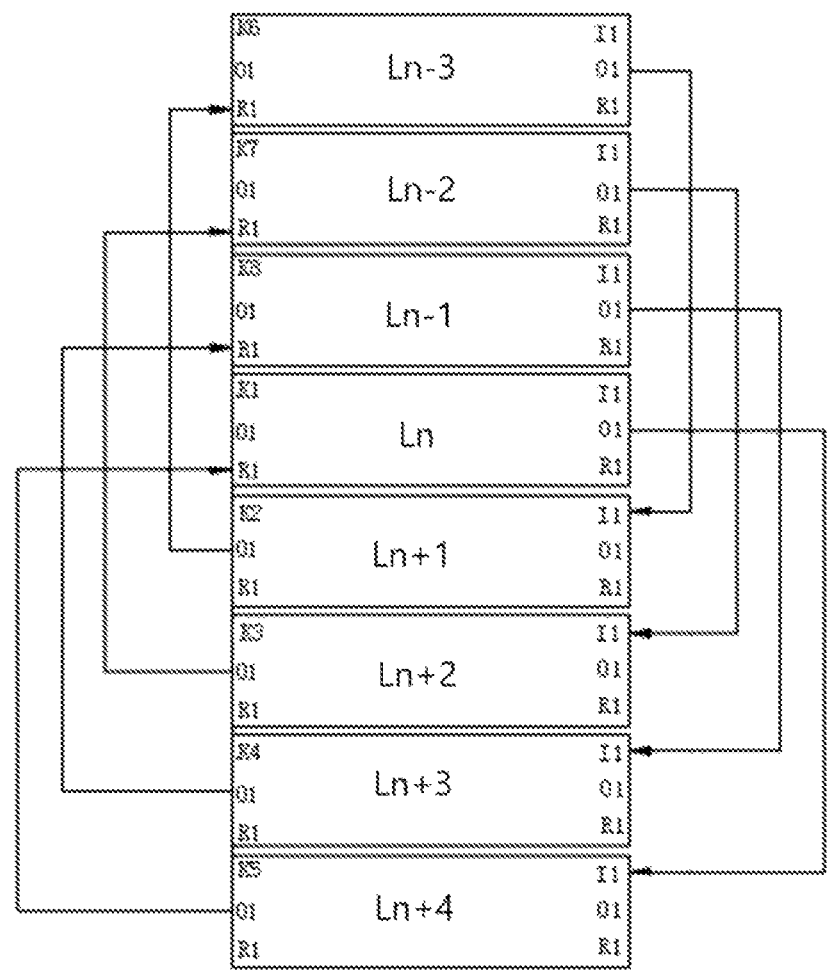
FIG. 3 is a schematic diagram of multiple stages of shift register units included in a related gate driving circuitry that are cascaded.

As shown in FIG. 3, the gate driving circuitry may include an (n−3)-th stage shift register unit Ln−3, an (n−2)-th stage shift register unit Ln−2, an (n−1)-th stage shift register unit Ln−1, an n-th stage shift register unit Ln, an (n+1)-th stage shift register unit Ln+1, an (n+2)-th stage shift register unit Ln+2, an (n+3)-th stage shift register unit Ln+3, and an (n+4)-th stage shift register unit Ln+4.

Ln−3 is coupled with the sixth clock signal K6, Ln−2 is coupled with the seventh clock signal K7, Ln−1 is coupled with the eighth clock signal K8, Ln is coupled with the first clock signal K1, Ln+1 is coupled with the second clock signal K2, Ln+2 is coupled with the third clock signal K3, Ln+3 is coupled with the fourth clock signal K4, and Ln+4 is coupled with the fifth clock signal K5.

A gate drive signal output terminal of Sn+1 is electrically coupled with a reset terminal of Sn−3, a gate drive signal output terminal of Sn+2 is electrically coupled with a reset terminal of Sn−2, a gate drive signal output terminal of Sn+3 is electrically coupled with a reset terminal of Sn−1, and a gate drive signal output terminal of Sn+4 is electrically coupled with a reset terminal of Sn.

A gate drive signal output terminal of Sn−3 is electrically coupled with an input terminal of Sn+1, a gate drive signal output terminal of Sn−2 is electrically coupled with an input terminal of Sn+2, a gate drive signal output terminal of Sn−1 is electrically coupled with an input terminal of Sn+3, and a gate drive signal output terminal of Sn is electrically coupled with an input terminal of Sn+4.

In FIG. 3, a gate drive signal output terminal is labeled O1, a terminal labeled R1 is a reset terminal, and a terminal labeled I1 is an input terminal.

Optionally, N is greater than or equal to 2, and is less than or equal to 10.

In specific implementation, in a period when initial N rows of gate lines are turned on immediately after entering the display time period from the touch time period within the display cycle, the clock signal is controlled and adjusted, to increase a falling speed of a potential of a gate drive signal outputted by the shift register unit, and N can be selected according to actual conditions. For example, N may be greater than or equal to 2, and less than or equal to 10, but is not limited to this.

According to a specific embodiment, a potential of the clock signal is switched between a low potential and a high potential, the high potential is higher than the low potential, and the controlling and adjusting the clock signal includes: when the potential of the clock signal is a low potential, adjusting the potential of the clock signal from a first low potential to a second low potential, where the second low potential is lower than the first low potential.

In specific implementation, the driving method further includes: in the display cycle, after the period during which the N rows of gate lines are turned on has elapsed after entering the display time period from the touch time period, and when the potential of the clock signal is a low potential, controlling the potential of the clock signal to be restored from the second low potential to the first low potential.

In actual operation, it is possible to decrease the low voltage value of the clock signal after pits occurs, that is, within the period during which the N rows of gate lines are turned on after entering the display time period from the touch time period, and the method of increasing a voltage difference is to increase a falling speed of the potential of the gate drive signal outputted by the shift register unit. That is, when the potential of the clock signal is a low potential, the potential of the clock signal is decreased from the first low potential to the second low potential, and the second low potential is lower than the first low potential, so as to increase the falling speed of the potential of the gate drive signal at the falling edge of the gate drive signal. Subsequent to the period during which the N rows of gate lines have been turned on immediately after entering the display time period from the touch time period, the low voltage value of the clock signal is restored, that is, controlling the potential of the clock signal to be restored from the second low potential to the first low potential, when the potential of the clock signal is a low potential.

Figure 4:
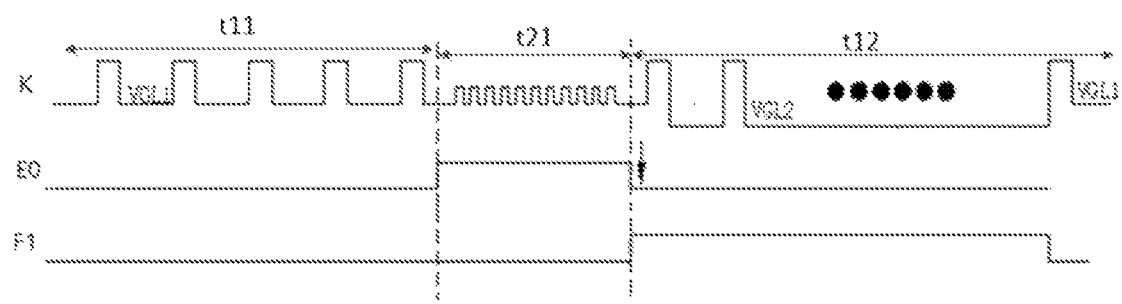
FIG. 4 is a sequence diagram of a clock signal, a touch enable signal and a voltage value setting control signal when a low voltage value of the clock signal is controlled and adjusted.

In specific implementation, the low voltage value of the clock signal may be controlled and adjusted by counting, and a count value J1 may be set, where an initial value of J1 is 0. As shown in FIG. 4, an example is given for description that the display panel sequentially works in a first display time period t11, a first touch time period t21, and a second display time period t12. In a case that a touch display panel starts to display, in the first display time period t11, each time when a row of pixel circuit is scanned, J1 is increased by 1. When J1 is greater than a display count value D1, the touch display panel enters a touch time period, J1 is reset to 0, and then J1 is increased by 1 each time when a row of touch electrodes is scanned. When J1 is greater than a touch count value P1, the touch display panel enters a display time period, J1 is reset to 0, and J1 is increased by 1 each time when a row of pixel circuits scanned. When J1 is less than or equal to N, a potential of a voltage value setting control signal F1 is a high voltage, a low voltage value of the clock signal K is a second low voltage VGL2; when J1 is greater than N, the potential of the voltage value setting control signal F1 is a low voltage, and the low voltage value of the clock signal K is restored to the first low potential VGL1; and the first low potential VGL1 is higher than the second low potential VGL2.

As shown in FIG. 4, in the first display time period t11, the low voltage value of the clock signal K is VGL1. In the first display time period t11 and the second display time period t12, a touch enable signal E0 is a low voltage. In the first touch time period t21, the touch enable signal E0 is a high voltage.

In at least one embodiment of the present disclosure, the display count value D1 and the touch count value P1 are both positive integers, and the value of D1 and the value of P1 may be selected according to actual conditions.

Figure 5:
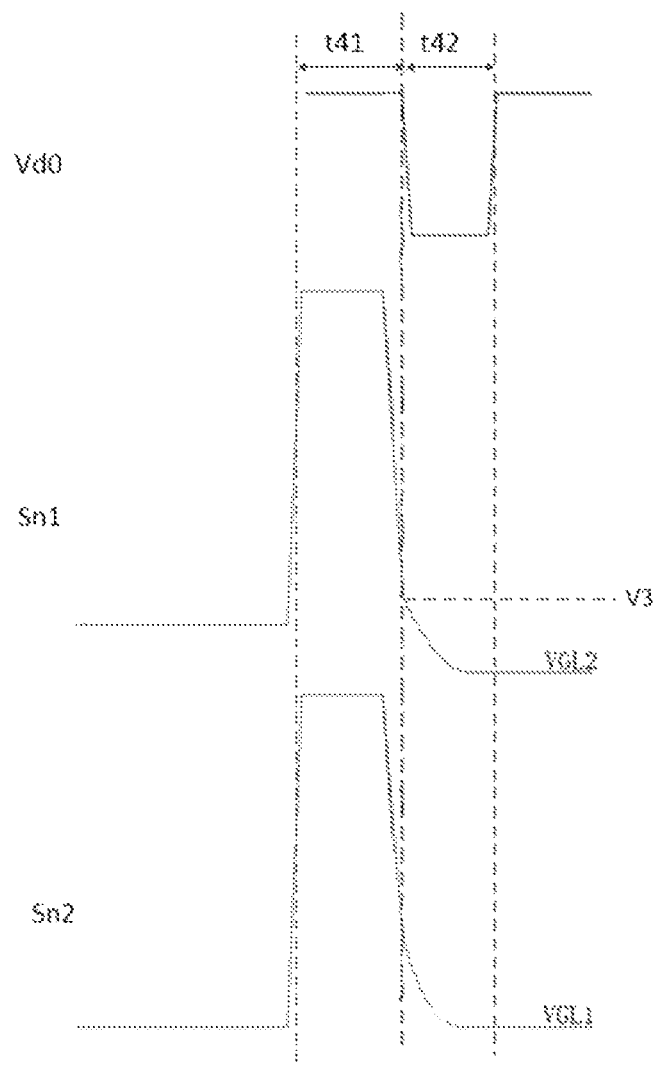
FIG. 5 is a diagram of a waveform of a gate drive signal Sn1 of an n-th row after a low voltage value of the clock signal has been adjusted, and a waveform of a gate drive signal Sn2 of the n-th row in a case that the low voltage value of the clock signal is not adjusted.

As shown in FIG. 5, a data voltage on a data line is represented by Vd0, a gate drive signal of the n-th row after the low voltage value of the clock signal has been adjusted is represented by Sn1, and a gate drive signal of the n-th row in a case that the low voltage value of the clock signal is not adjusted is represented by Sn1.

It is assumed that when the second display time period starts at the end of the first touch time period, a gate line of the n-th row in the touch display panel starts to be scanned. By comparing Sn1 with Sn2, it can be seen that, for a falling edge of the gate drive signal in the n-th row, a falling speed of Sn1 is greater than a falling speed of Sn2.

In FIG. 5, a period during which a gate line of the n-th row is turned on is represented by t41, and a period during which a gate line of the (n+1)-th row is turned on is represented by t42.

In a specific implementation, VGL2 needs to be set based on the requirement of an actual product, so that defects of a horizontal stripe after a pit occurs can be reduced, and the power consumption may not be increased significantly. As can be seen from the waveform of Sn1 in FIG. 5, a falling speed of the gate drive signal in the n-th row increases, and the potential of the gate drive signal in the n-th row reaches a first predetermined voltage V3 before a data voltage of the next row arrives, where V3 is lower than a turn-off voltage of a gate electrode of a data writing transistor coupled with the gate drive signal of the n-th row.

Figure 6:
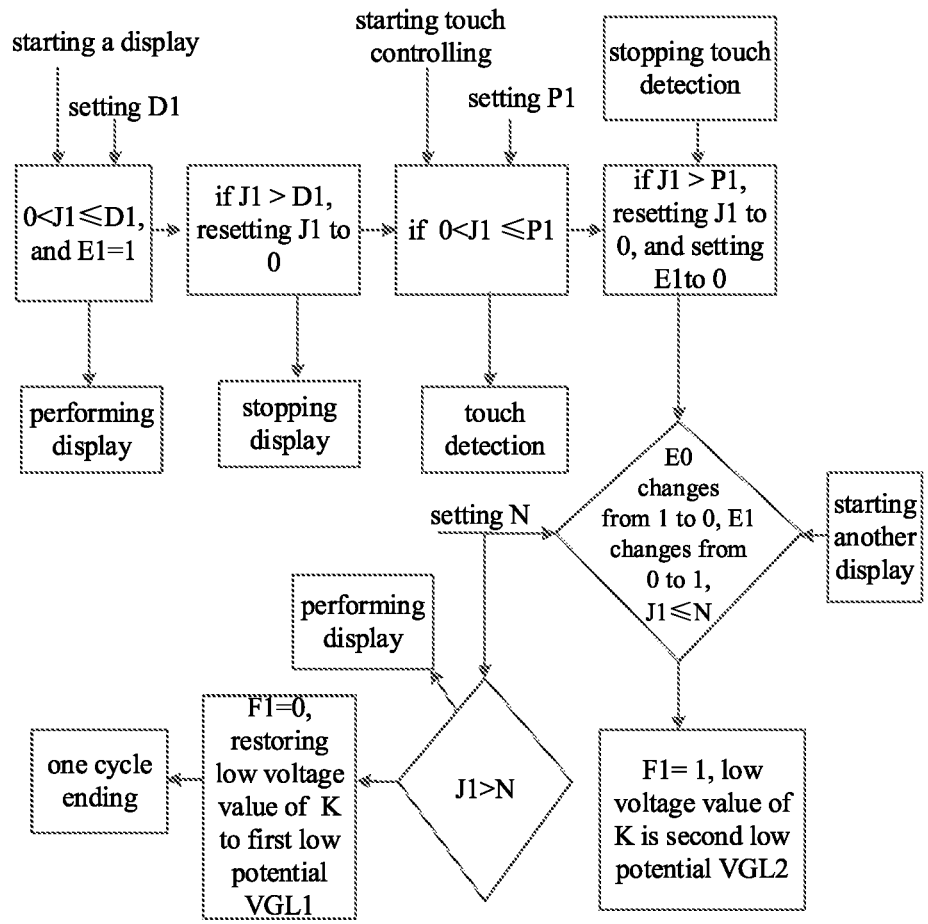
FIG. 6 is a flow chart of a first driving method.

As shown in FIG. 6, at the beginning of a display, an initial value of the count value J1 is 0, and the display count value D1 is set; after the display starts, every time when a row of pixel circuit is scanned, J1 is increased by 1. When J1 is greater than 0, and is less than or equal to D1, a display enable signal E1 is 1 (that is, the display enable signal E1 is a high voltage signal), and the display starts; when J1 is greater than D1, J1 is reset to 0, E1 is set to 0 (that is, the display enable signal E1 is a low voltage signal), and the display stops.

At the beginning of touch controlling, J1 is reset to 0, and the touch count value P1 is set. After the touch controlling starts, every time when a row of touch electrodes is scanned, J1 is increased by 1. When J1 is greater than 0, and is less than or equal to P1, a touch enable signal E0 is 1 (that is, the touch enable signal E0 is a high voltage signal), and touch detection starts; when J1 is greater than P1, J1 is reset to 0, E1 is set to 0 (that is, the touch enable signal E0 is a low voltage signal), and the touch detection stops.

At the beginning of another display, E1 changes from 0 to 1, and J1 is increased by 1 every time when a row of pixel circuit is scanned. In a case that E0 changes from 1 to 0, and E1 changes from 0 to 1, when J1 is less than or equal to N, the voltage value setting control signal F1 is 1 (that is, F1 is a high voltage signal), the low voltage value of the clock signal K is the second low potential VGL2; when J1 is greater than N, F1 is set to 0 (F1 is a low voltage signal), the low voltage value of the clock signal K is restored to the first low potential VGL1, and one cycle ends.

According to another specific embodiment, the potential of the clock signal is switched between a low potential and a high potential, the high potential is higher than the low potential, and the controlling and adjusting the clock signal includes:

when the potential of the clock signal is the high potential, increasing the potential of the clock signal from a first high potential to a second high potential.

In specific implementation, the driving method further includes: in the display cycle, subsequent to the period during which the N rows of gate lines are turned on after entering the display time period from the touch time period, when the potential of the clock signal is a high potential, controlling the potential of the clock signal to be restored from the second high potential to the first high potential.

In actual operation, it is possible to increase the high voltage value of the clock signal after pits occurs, that is, within the period during which the N rows of gate lines are turned on immediately after entering the display time period from the touch time period, and the method of increasing a voltage difference is to increase a falling speed of the potential of the gate drive signal outputted by the shift register unit. That is, when the potential of the clock signal is a high potential, the potential of the clock signal is increased from the first high potential to the second high potential, and the second high potential is higher than the first high potential, so as to increase the falling speed of the potential of the gate drive signal at the falling edge of the gate drive signal. After the period during which the N rows of gate lines have been turned on has elapsed immediately after entering the display time period from the touch time period, the high voltage value of the clock signal is restored, that is, controlling the potential of the clock signal to be restored from the second high potential to the first high potential, when the potential of the clock signal is a high potential.

Figure 7:
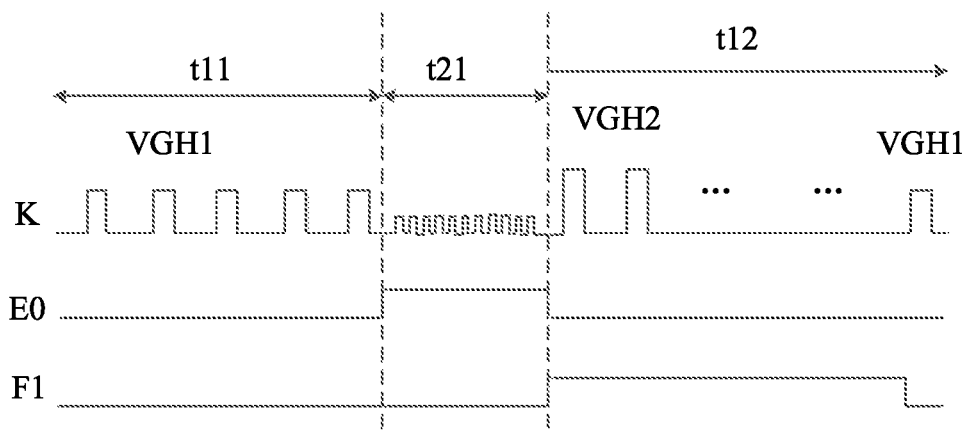
FIG. 7 is a sequence diagram of a clock signal, a touch enable signal and a voltage value setting control signal when a high voltage value of the clock signal is controlled and adjusted.

In specific implementation, the high voltage value of the clock signal may be controlled and adjusted by counting, and a count value J1 may be set, where an initial value of J1 is 0. As shown in FIG. 7, an example is given for description that the display panel sequentially works in a first display time period t11, a first touch time period t21, and a second display time period t12. In a case that a touch display panel starts to display, in the first display time period t11, each time when a row of pixel circuit is scanned, J1 is increased by 1. When J1 is greater than a display count value D1, the touch display panel enters a touch time period, J1 is reset to 0, and then J1 is increased by 1 each time when a row of touch electrodes is scanned. When J1 is greater than a touch count value P1, the touch display panel enters a display time period, J1 is reset to 0, and J1 is increased by 1 each time when a row of pixel circuits scanned. When J1 is less than or equal to N, a potential of a voltage value setting control signal F1 is a high voltage, a high voltage value of the clock signal K is a second low voltage VGH2; when J1 is greater than N, the potential of the voltage value setting control signal F1 is a low voltage, and the high voltage value of the clock signal K is restored to the first high potential VGH1; and VGH1 is lower than VGH2.

As shown in FIG. 7, in the first display time period t11, the high voltage value of the clock signal K is VGH1. In the first display time period t11 and the second display time period t12, a touch enable signal E0 is at a low voltage. In the first touch time period t21, the touch enable signal E0 is at a high voltage.

Figure 8:
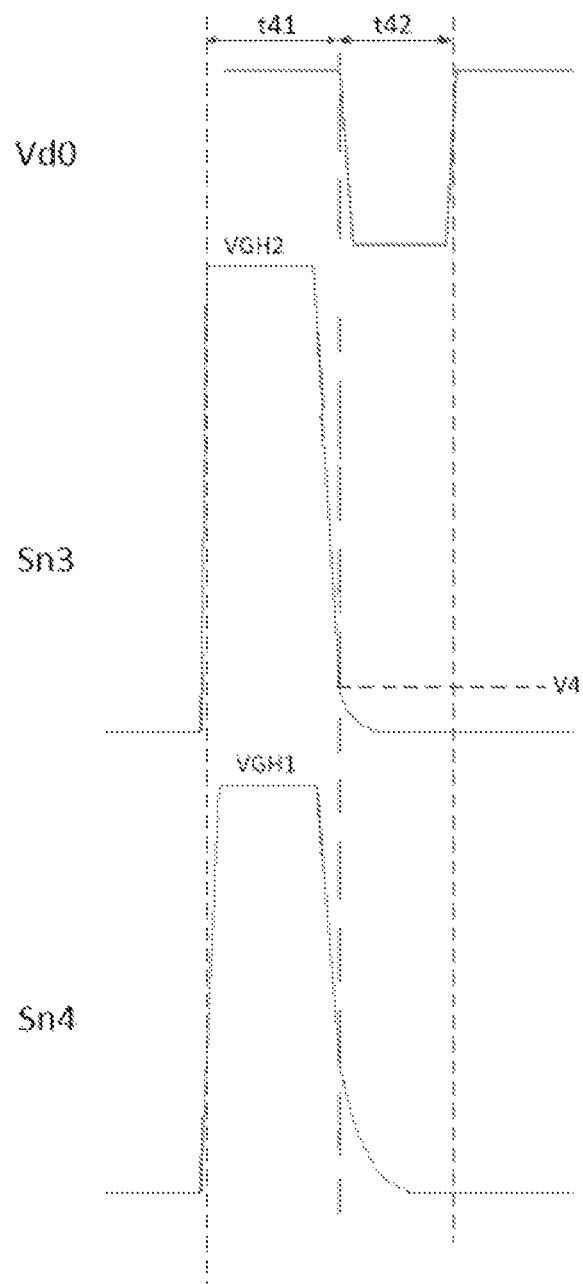
FIG. 8 is a diagram of a waveform of a gate drive signal Sn+2 of an n-th row after a high voltage value of the clock signal has been adjusted, and a waveform of a gate drive signal Sn+3 of the n-th row in a case that the high voltage value of the clock signal is not adjusted.

As shown in FIG. 8, a data voltage at a data line is represented by Vd0, a gate drive signal of the n-th row after the high voltage value of the clock signal has been adjusted is represented by Sn3, and a gate drive signal of the n-th row in a case that the high voltage value of the clock signal is not adjusted is represented by Sn4.

It is assumed that when the second display time period starts at the end of the first touch time period, a gate line of the n-th row in the touch display panel starts to be scanned. By comparing Sn3 with Sn4, it can be seen that, for a falling edge of the gate drive signal in the n-th row, a falling speed of Sn3 is greater than a falling speed of Sn4.

In FIG. 8, a reference sign t41 represents a period during which a gate line of the n-th row is turned on, and a reference sign t42 represents a period during which a gate line of the (n+1)-th row is turned on.

As can be seen from Sn3 in FIG. 8, a falling speed of the gate drive signal in the n-th row increases, and the potential of the gate drive signal in the n-th row reaches a second predetermined voltage V4 before a data voltage of the next row arrives, where V4 is lower than a turn-off voltage of a gate electrode of a data writing transistor coupled with the gate drive signal of the n-th row.

Figure 9:
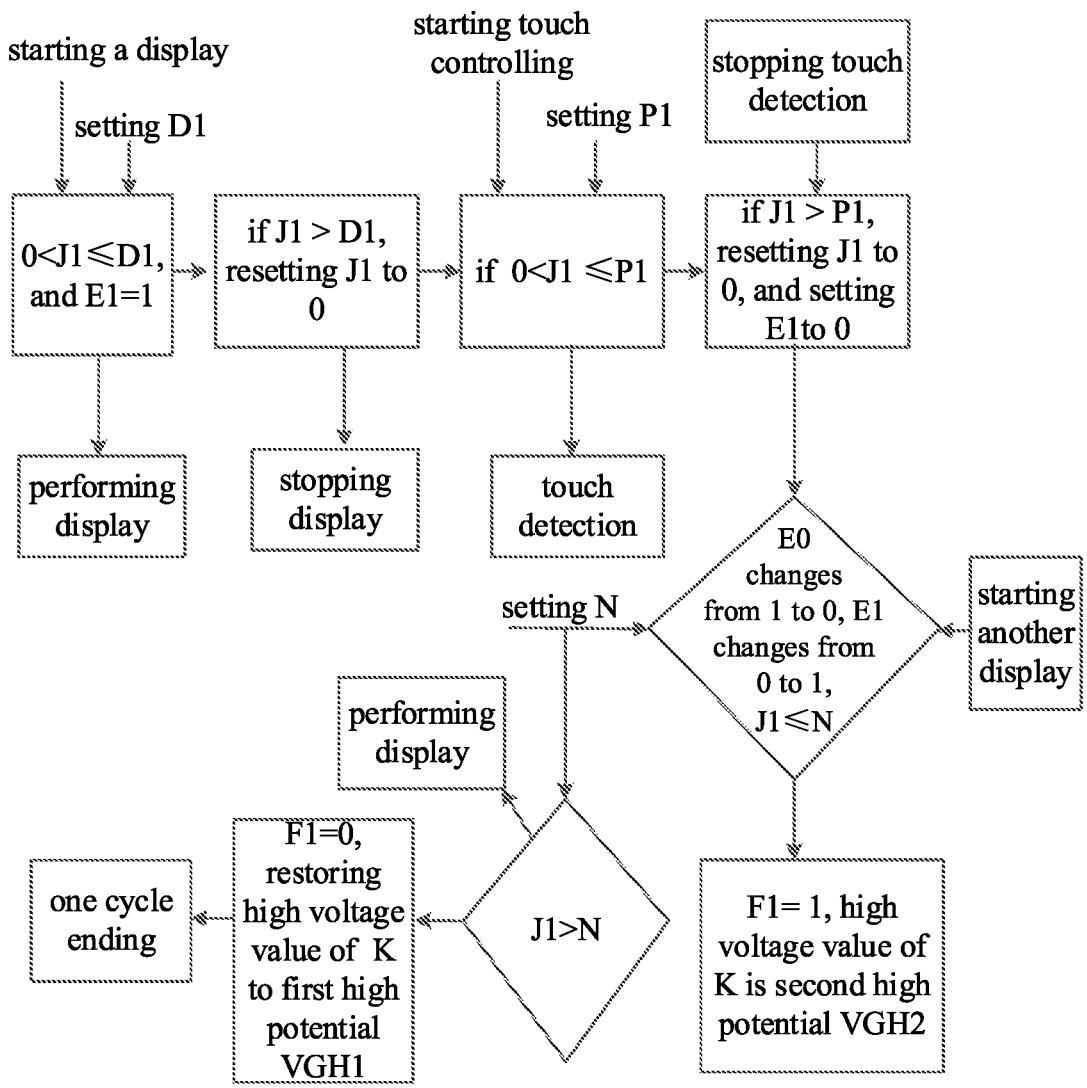
FIG. 9 is a flow chart of a second driving method.

As shown in FIG. 9, at the beginning of a display, an initial value of the count value J1 is 0, and the display count value D1 is set. After the display starts, every time when a row of pixel circuit is scanned, J1 is increased by 1. When J1 is greater than 0, and is less than or equal to D1, a display enable signal E1 is 1 (that is, the display enable signal E1 is a high voltage signal), and the display starts; when J1 is greater than D1, J1 is reset to 0, E1 is set to 0 (that is, the display enable signal E1 is a low voltage signal), and this display stops.

At the beginning of touch controlling, J1 is reset to 0, and the touch count value P1 is set. After the touch controlling starts, every time when a row of touch electrodes is scanned, J1 is increased by 1. When J1 is greater than 0, and is less than or equal to P1, a touch enable signal E0 is 1 (that is, the touch enable signal E0 is a high voltage signal), and touch detection starts; when J1 is greater than P1, J1 is reset to 0, E1 is set to 0 (that is, the touch enable signal E0 is a low voltage signal), and the touch detection stops.

At the beginning of another display, E1 changes from 0 to 1, and J1 is increased by 1 every time when a row of pixel circuit is scanned. In a case that E0 changes from 1 to 0, and E1 changes from 0 to 1, when J1 is less than or equal to N, the voltage value setting control signal F1 is 1 (that is, F1 is a high voltage signal), the high voltage value of the clock signal K is a second high potential VGH2; when J1 is greater than N, F1 is set to 0 (F1 is a low voltage signal), the high voltage value of the clock signal K is restored to the first high potential VGH1, and one cycle ends.

According to another specific embodiment, a potential of the clock signal is switched between a low potential and a high potential, and the high potential is higher than the low potential; the clock signal terminal is electrically coupled with a voltage control terminal via a switch control circuit, and the switch control circuit is configured to control the voltage control terminal to provide a low voltage signal to the clock signal terminal; the controlling and adjusting the clock signal includes:

when the switch control circuit controls the voltage control terminal to provide a low voltage signal to the clock signal terminal, decreasing a resistance value of the switch control circuit from a first resistance value to a second resistance value.

In specific implementation, the voltage control terminal is used to provide a low voltage signal.

In at least one embodiment of the present disclosure, when the switch control circuit controls the voltage control terminal to provide a low voltage signal to the clock signal terminal, the resistance value of the switch control circuit can be reduced to increase a falling speed of a potential of a gate drive signal at a falling edge of the gate drive signal after a pit occurs.

In at least one embodiment of the present disclosure, when the switch control circuit controls the voltage control terminal to provide a low voltage signal to the clock signal terminal, the resistance value of the switch control circuit is an impedance in a turned-on state of the switch control circuit. When the switch control circuit controls the voltage control terminal to provide a low voltage signal to the clock signal terminal, the switch control circuit turns on a connection between the voltage control terminal and the clock signal terminal, then at this time, the resistance value of the switch control circuit is the impedance in a turned-on state of the switch control circuit.

In specific implementation, the driving method further includes: in the display cycle, after the period during which the N rows of gate lines are turned has elapsed on after entering the display time period from the touch time period, and when the switch control circuit controls the voltage control terminal to provide the low voltage signal to the clock signal terminal, restoring the resistance value of the switch control circuit from the second resistance value to the first resistance value.

In actual operation, an area of a connection channel in the switch control circuit may be increased to increase the thrust after the pit occurs, thereby to achieve a rapid pull-down of the clock signal provided by the clock signal terminal and to increase a falling speed of a potential of a gate drive signal. Subsequently to the period during which N rows of gate lines are turned on after entering the display time period from the touch time period, the resistance value of the switch control circuit is restored from the second resistance value to the first resistance value. Therefore, a defect problem of horizontal stripes after the pit occurs can be solved, and the low voltage value of the clock signal would not maintain at a high thrust range (a transient current would increase), so as to avoid the risk of EMI (electromagnetic interference).

In at least one embodiment of the present disclosure, the second resistance value is less than the first resistance value.

In at least one embodiment of the present disclosure, the voltage control terminal may be a low voltage terminal, but is not limited to this.

In specific implementation, the resistance value of the switch control circuit can be controlled and adjusted by counting, and a count value J1 may be set, where an initial value of J1 is 0. That the touch display panel is operated, in sequence, in a first display time period, a first touch time period, and a first display time period is given as an example for explanation. In a case that the touch display panel starts to display, in the first display time period, every time a row of pixel circuits is scanned, J1 is increased by 1. When J1 is greater than a display count value D1, the touch display panel enters a touch time period, J1 is reset to 0, and then J1 is increased by 1 each time when a row of touch electrodes is scanned. When J1 is greater than a touch count value P1, the touch display panel enters a display time period, J1 is reset to 0, and J1 is increased by 1 each time when a row of pixel circuits scanned. When J1 is less than or equal to N, the resistance value of the switch control circuit is decreased from the first resistance value to the second resistance value, and when J2 is greater than N, the resistance value of the switch control circuit is restored to first resistance value, from the second resistance value, where the first resistance value is greater than the second resistance value.

In the first display time period, the resistance value of the switch control circuit is the first resistance value.

Figure 10:
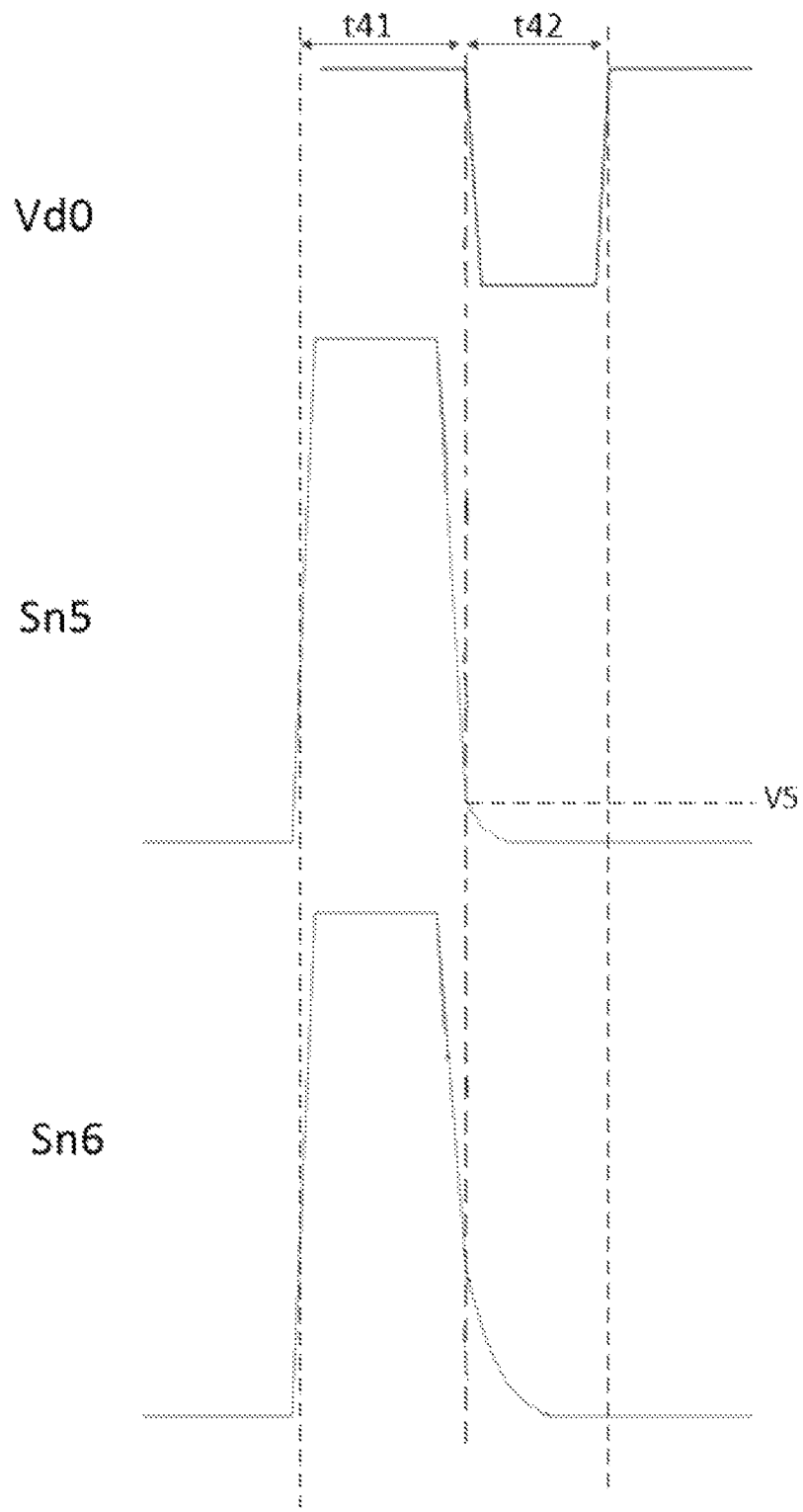
FIG. 10 is a diagram of a waveform of a gate drive signal Sn+4 of an n-th row after a resistance value of a switch control circuit has been adjusted, and a waveform of a gate drive signal Sn+5 of the n-th row in a case that the resistance value of the switch control circuit is not adjusted.

As shown in FIG. 10, a data voltage at a data line is represented by Vd0, a gate drive signal of the n-th row after the resistance value of the switch control circuit has been adjusted is represented by Sn5, and a gate drive signal of the n-th row in a case that the resistance value of the switch control circuit is not adjusted is represented by Sn6.

It is assumed that when the second display time period starts at the end of the first touch time period, a gate line of the n-th row in the touch display panel starts to be scanned. By comparing Sn4 with Sn6, it can be seen that, for a falling edge of the gate drive signal in the n-th row, a falling speed of Sn5 is greater than a falling speed of Sn6. As can be seen from a waveform of Sn5 in FIG. 10, a falling speed of the gate drive signal in the n-th row increases, and the potential of the gate drive signal in the n-th row reaches a third predetermined voltage V5 before a data voltage of the next row arrives, where V5 is lower than a turn-off voltage of a gate electrode of a data writing transistor coupled with the gate drive signal of the n-th row.

In FIG. 10, a reference sign t41 represents a period during which a gate line of the n-th row is turned on, and a reference sign t42 represents a period during which a gate line of the (n+1)-th row is turned on.

Figure 11:
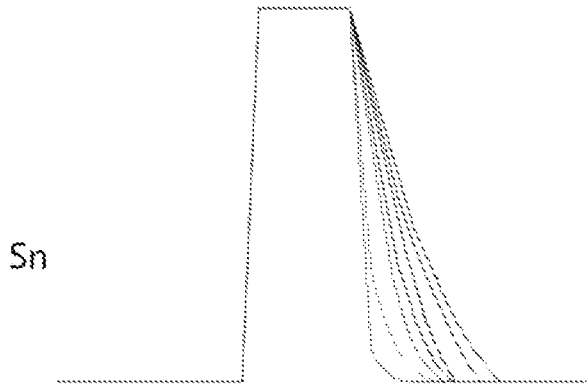
FIG. 11 is a waveform diagram of a gate drive signal Sn in an n-th row as an impedance in a turned-on state of a switch control circuit increases.

As shown in FIG. 11, as the impedance in a turned-on state of the switch control circuit increases, falling edges of the gate drive signal Sn in the n-th row are arranged from right to left, and the falling speed of the potential of the n-th gate drive signal gradually decreases from left to right.

In at least one embodiment of the present disclosure, in the display cycle, in the period during which the initial N rows of gate lines are turned on after entering the display time period from the touch time period, the controlling and adjusting the clock signal may include: in the display cycle, when entering the display time period from the touch time period, setting a count value to 0;

after entering the display time period from the touch time period, increasing the count value by 1, each time when a period that one of the N rows of gate lines is turned on has elapsed; and when the count value is less than or equal to N, controlling and adjusting the clock signal.

In specific implementation, the clock signal may be adjusted by setting the count value.

Figure 12:
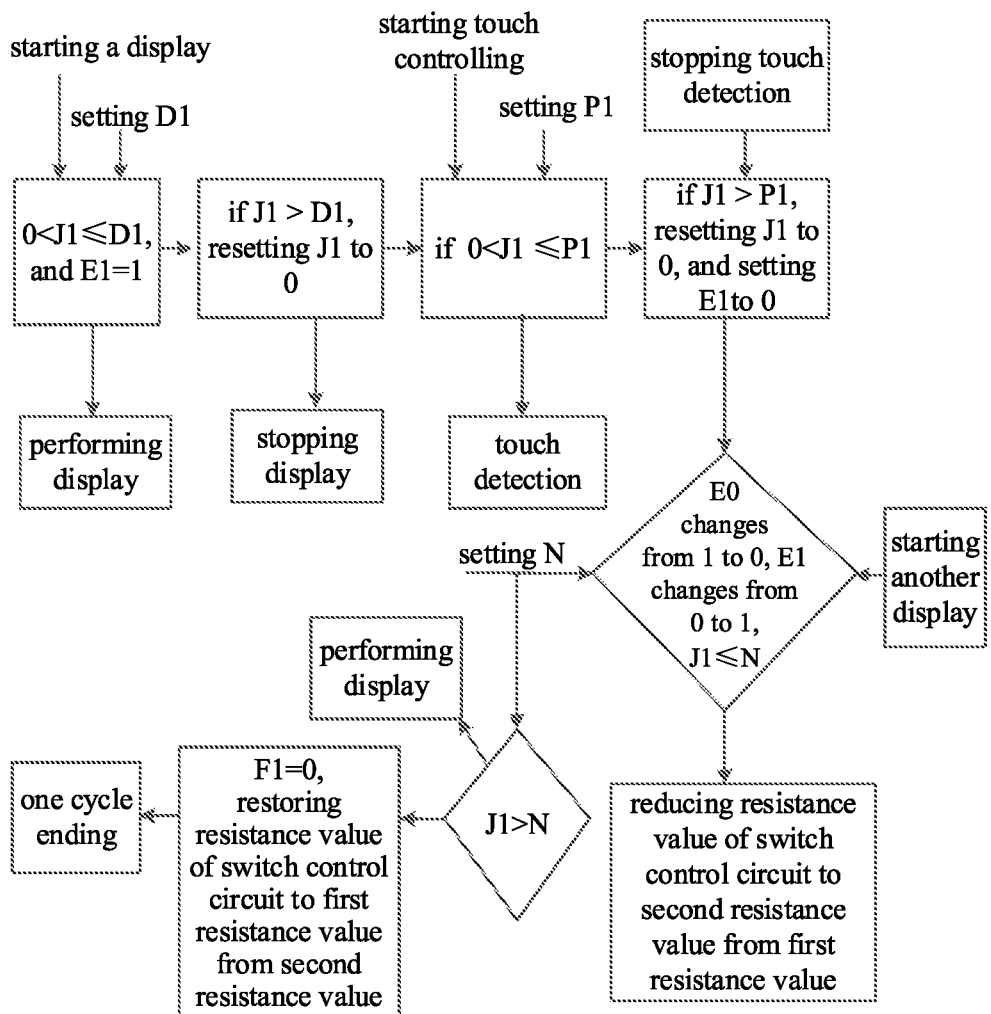
FIG. 12 is a flow chart of a third driving method.

As shown in FIG. 12, at the beginning of a display, an initial value of a count value J1 is 0, and a display count value D1 is set. After the display starts, every time a row of pixel circuits is scanned, J1 is increased by 1. When J1 is greater than 0, and is less than or equal to D1, a display enable signal E1 is 1 (that is, the display enable signal E1 is a high voltage signal), and the display starts; when J1 is greater than D1, J1 is reset to 0, E1 is set to 0 (that is, the display enable signal E1 is a low voltage signal), and the display stops.

At the beginning of touch controlling, J1 is reset to 0, and the touch count value P1 is set. After the touch controlling starts, every time when a row of touch electrodes is scanned, J1 is increased by 1. When J1 is greater than 0, and is less than or equal to P1, a touch enable signal E0 is 1 (that is, the touch enable signal E0 is a high voltage signal), and touch detection starts; when J1 is greater than P1, J1 is reset to 0, E1 is set to 0 (that is, the touch enable signal E0 is a low voltage signal), and the touch detection stops.

At the beginning of another display, E1 changes from 0 to 1, and J1 is increased by 1 every time when a row of pixel circuit is scanned. In a case that E0 changes from 1 to 0, and E1 changes from 0 to 1, when J1 is less than or equal to N, the resistance value of the switch control circuit is reduced to the second resistance value from the first resistance value; when J1 is greater than N, the resistance value of the switch control circuit is restored to the first resistance value from the second resistance value, and one cycle ends.

Figure 13:
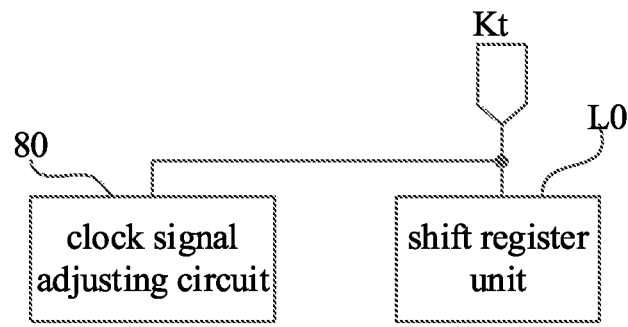
FIG. 13 is a structural diagram of a driving circuitry according to at least one embodiment of the present disclosure.

A driving circuitry is provided in at least one embodiment of the present disclosure, which is applied to a touch display panel. As shown in FIG. 13, a shift register unit L0 included in a gate driving circuitry in the touch display panel is coupled with a clock signal terminal Kt. The clock signal terminal Kt is used to provide a clock signal for a pull-up circuit in the shift register unit L0, and the display cycle includes a display time period and a touch time period that are alternately set. The driving circuitry includes:

a clock signal adjusting circuit 80 is electrically coupled with the clock signal terminal Kt, and is configured to: within a period during which initial N rows of gate lines are turned on after entering the display time period from the touch time period in the display cycle, control and adjust the clock signal to increase a falling speed of a potential of a gate drive signal outputted by the shift register unit L0; N is a positive integer.

In the at least one embodiment of the present disclosure, the falling speed of a falling edge of the gate drive signal is dynamically enhanced after pits occur (the pits occur when entering the display time period from the touch time period) to prevent a signal mischarging, thereby solving a wrong charging problem caused by that the falling speed of the falling edge of the gate drive signal becomes slower, so as to improve undesirable phenomena of pit-like horizontal stripes.

Optionally, N is greater than or equal to 2, and is less than or equal to 10.

According to a specific embodiment, a potential of the clock signal is switched between a low potential and a high potential, and the high potential is higher than the low potential; and the clock signal adjusting circuit is specifically configured to decrease the potential of the clock signal from a first low potential to a second low potential, within the period during which the initial N rows of gate lines are turned on after entering the display time period from the touch time period in the display cycle, when the potential of the clock signal is a low potential.

In a specific implementation, the clock signal adjusting circuit is further configured to control the potential of the clock signal to be restored from the second low potential to the first low potential, after the period during which the N rows of gate lines are turned on has lapsed after entering the display time period from the touch time period in the display cycle, and when the potential of the clock signal is the low potential.

In actual operation, it is possible to decrease the low voltage value of the clock signal after pits occurs, that is, within the period during which the N rows of gate lines are turned on after entering the display time period from the touch time period, and the method of increasing a voltage difference is to increase a falling speed of the potential of the gate drive signal outputted by the shift register unit. That is, when the potential of the clock signal is a low potential, the potential of the clock signal is decreased from the first low potential to the second low potential, and the second low potential is lower than the first low potential, so as to increase the falling speed of the potential of the gate drive signal at the falling edge of the gate drive signal. Subsequent to the period during which the N rows of gate lines have been turned on immediately after entering the display time period from the touch time period, the low voltage value of the clock signal is restored, that is, controlling the potential of the clock signal to be restored from the second low potential to the first low potential, when the potential of the clock signal is a low potential.

According to another specific embodiment, a potential of the clock signal is switched between a low potential and a high potential, and the high potential is higher than the low potential;

the clock signal adjusting circuit is specifically configured to increase the potential of the clock signal from a first high potential to a second high potential, within the period during which the initial N rows of gate lines are turned on after entering the display time period from the touch time period in the display cycle, when the potential of the clock signal is the high potential.

In a specific implementation, the clock signal adjusting circuit is also configured to: control the potential of the clock signal to be restored from the second high potential to the first high potential, after the period during which the initial N rows of gate lines are turned on has lapsed after entering the display time period from the touch time period in the display cycle, and when the potential of the clock signal is the high potential.

In actual operation, it is possible to increase the high voltage value of the clock signal after pits occurs, that is, within the period during which the N rows of gate lines are turned on immediately after entering the display time period from the touch time period, and the method of increasing a voltage difference is to increase a falling speed of the potential of the gate drive signal outputted by the shift register unit. That is, when the potential of the clock signal is a high potential, the potential of the clock signal is increased from the first high potential to the second high potential, and the second high potential is higher than the first high potential, so as to increase the falling speed of the potential of the gate drive signal at the falling edge of the gate drive signal. After the period during which the N rows of gate lines have been turned on has elapsed immediately after entering the display time period from the touch time period, the high voltage value of the clock signal is restored, that is, controlling the potential of the clock signal to be restored from the second high potential to the first high potential, when the potential of the clock signal is a high potential.

According to another specific embodiment, a potential of the clock signal is switched between a low potential and a high potential, and the high potential is higher than the low potential. The driving circuitry further includes a switch control circuit. The clock signal terminal is electrically coupled with a voltage control terminal via the switch control circuit, and the switch control circuit is configured to control the voltage control terminal to provide a low voltage signal to the clock signal terminal; and the clock signal adjusting circuit is specifically configured to decrease a resistance value of the switch control circuit from a first resistance value to a second resistance value, within the period during which the initial N rows of gate lines are turned on after entering the display time period from the touch time period in the display cycle, and when the switch control circuit controls the voltage control terminal to provide the low voltage signal to the clock signal terminal.

In a specific implementation, the clock signal adjusting circuit is further configured to restore the resistance value of the switch control circuit from the second resistance value to the first resistance value, after the period during which the N rows of gate lines are turned on has elapsed after entering the display time period from the touch time period in the display cycle, and when the switch control circuit controls the voltage control terminal to provide the low voltage signal to the clock signal terminal.

In at least one embodiment of the present disclosure, when the switch control circuit controls the voltage control terminal to provide a low voltage signal to the clock signal terminal, the resistance value of the switch control circuit can be reduced to increase a falling speed of a potential of a gate drive signal at a falling edge of the gate drive signal after a pit occurs.

In at least one embodiment of the present disclosure, when the switch control circuit controls the voltage control terminal to provide a low voltage signal to the clock signal terminal, the resistance value of the switch control circuit is an impedance in a turned-on state of the switch control circuit. When the switch control circuit controls the voltage control terminal to provide a low voltage signal to the clock signal terminal, the switch control circuit turns on a connection between the voltage control terminal and the clock signal terminal, then at this time, the resistance value of the switch control circuit is the impedance in a turned-on state of the switch control circuit.

In actual operation, an area of a connection channel in the switch control circuit may be increased to increase the thrust after the pit occurs, thereby to achieve a rapid pull-down of the clock signal provided by the clock signal terminal and to increase a falling speed of a potential of a gate drive signal. Subsequently to the period during which N rows of gate lines are turned on after entering the display time period from the touch time period, the resistance value of the switch control circuit is restored from the second resistance value to the first resistance value. Therefore, a defect problem of horizontal stripes after the pit occurs can be solved, and the low voltage value of the clock signal would not maintain at a high thrust range (a transient current would increase), so as to avoid the risk of EMI (electromagnetic interference).

In at least one embodiment of the present disclosure, the second resistance value is less than the first resistance value.

In at least one embodiment of the present disclosure, the voltage control terminal may be a low voltage terminal, but is not limited to this.

Figure 14:
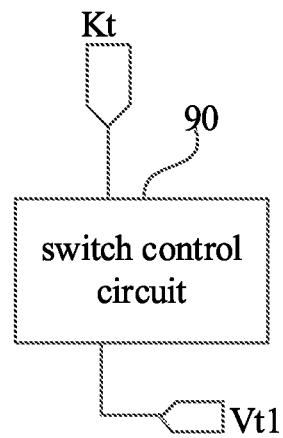
FIG. 14 is a structural diagram of a switch control circuit included in the driving circuitry.

As shown in FIG. 14, the driving circuitry includes a switch control circuit 90; a clock signal terminal Kt is electrically coupled with a voltage control terminal Vt1 through the switch control circuit 90, and the switch control circuit 90 is configured to control the voltage control terminal Vt1 to provide a low voltage signal for the clock signal terminal Kt.

The voltage control terminal Vt1 is used to provide the low voltage signal.

In a case that the switch control circuit 90 shown in FIG. 14 is working, when the switch control circuit 90 controls the voltage control terminal Vt1 to provide a low voltage signal to the clock signal terminal Kt, the resistance value of the switch control circuit 90 is an impedance in a turned-on state of the switch control circuit 90. When the switch control circuit 90 controls the voltage control terminal Vt1 to provide a low voltage signal to the clock signal terminal Kt, the switch control circuit 90 enables a connection between the voltage control terminal Vt1 and the clock signal terminal Kt, and the resistance value of the switch control circuit 90 is the impedance in a turned-on state of the switch control circuit 90 at this time.

In specific implementation, the voltage control terminal may be a low voltage terminal, but is not limited to this.

In at least one embodiment of the present disclosure, the switch control circuit may include M switch control transistors; M is greater than 1;

a control electrode of an m-th switch control transistor is electrically coupled with an m-th switch control terminal, a first electrode of the m-th switch control transistor is electrically coupled with the clock signal terminal, and a second electrode of the m-th switch control transistor is electrically coupled with the voltage control terminal; m is a positive integer less than or equal to M; and the clock signal adjusting circuit is configured to control at least two of the M switch control transistors to be turned on, within the period during which the initial N rows of gate lines are turned on after entering the display time period from the touch time period in the display cycle, when the switch control circuit controls the voltage control terminal to provide the low voltage signal to the clock signal terminal.

In a specific implementation, the clock signal adjusting circuit is further configured to: control a switch control transistor of the M switch control transistors to be turned on, and any other switch control transistors among the M switch control transistors except the switch control transistor to be turned off, after the period during which the N rows of gate lines are turned on has elapsed after entering the display time period from the touch time period in the display cycle, and when the switch control circuit controls the voltage control terminal to provide the low voltage signal to the clock signal terminal.

In a case that the switch control circuit includes M switch control transistors, within a period during which initial N rows of gate lines are turned on after entering the display time period from the touch time period in the display cycle, and when the switch control circuit controls the voltage control terminal to provide a low voltage signal for the clock signal terminal, at least two of the M switch control transistors are controlled to be turned on, so as to increase an area of a connected channel and increase the thrust, thereby to increase the impedance in a turned-on state of the switch control circuit and to achieve the objective of quickly pulling down the potential of the gate drive signal. After the period during which the N rows of gate lines are turned on has lapsed, and when the switch control circuit controls the voltage control terminal to provide a low-voltage signal to the clock signal terminal, a switch control transistor of the M switch control transistors is controlled to be turned on, and any other switch control transistors among the M switch control transistors except the switch control transistor are controlled to be turned off, so as to avoid the switch control circuit always maintaining at a high thrust, and to avoid the EMI risk.

Figure 15:
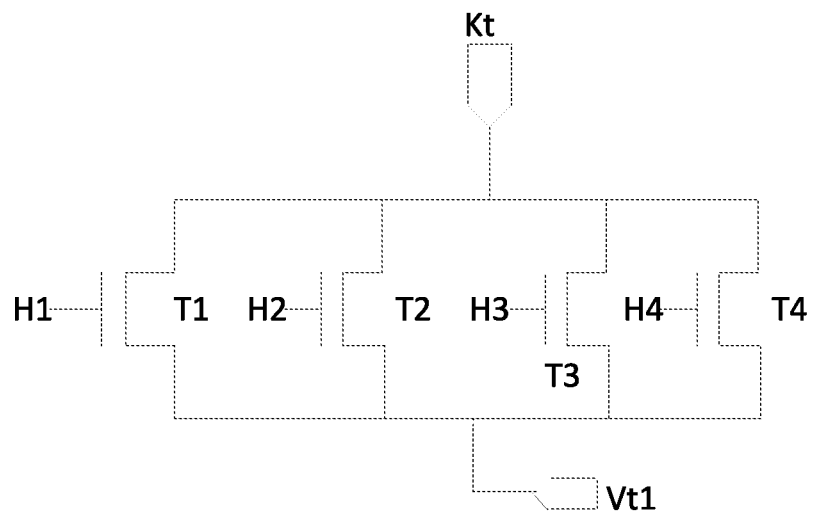
FIG. 15 is a circuit diagram of a switch control circuit according to at least one embodiment of the present disclosure.

As shown in FIG. 15, the switch control circuit may include a first switch control transistor T1, a second switch control transistor T2, a third switch control transistor T3, and a fourth switch control transistor T4.

A gate electrode of T1 is electrically coupled with a first switch control terminal H1, a source electrode of T1 is electrically coupled with the voltage control terminal Vt1, and a drain electrode of T1 is electrically coupled with the clock signal terminal Kt.

A gate electrode of T2 is electrically coupled with the second switch control terminal H2, a source electrode of T2 is electrically coupled with the voltage control terminal Vt1, and a drain electrode of T2 is electrically coupled with the clock signal terminal Kt.

A gate electrode of T3 is electrically coupled with the third switch control terminal H3, a source electrode of T3 is electrically coupled with the voltage control terminal Vt1, and a drain electrode of T3 is electrically coupled with the clock signal terminal Kt.

A gate electrode of T4 is electrically coupled with the fourth switch control terminal H4, a source electrode of T4 is electrically coupled with the voltage control terminal Vt1, and a drain electrode of T4 is electrically coupled with the clock signal terminal Kt.

In the at least one embodiment shown in FIG. 15, T1, T2, T3, and T4 may all be n-type thin film transistors, but they are not limited thereto. In actual operation, T1, T2, T3, and T4 may also be p-type transistors.

According to the at least one embodiment, in a case that the switch control circuit shown in FIG. 15 is in operation, within a period during which initial N rows of gate lines are turned on after entering the display time period from the touch time period in the display cycle, and when the switch control circuit controls the voltage control terminal to provide a low voltage signal for the clock signal terminal, at least two switch control transistors in T1, T2, T3, and T4 are controlled to be turned on, so as to increase an area of a connected channel and increase the thrust, thereby to increase the impedance in a turned-on state of the switch control circuit and to achieve the objective of quickly pulling down the potential of the gate drive signal. After the period during which the N rows of gate lines are turned on has lapsed, and when the switch control circuit controls the voltage control terminal Vt1 to provide a low-voltage signal to the clock signal terminal Kt, T1, T2, T3 and T4 are controlled to be turned on, and any other transistors are controlled to be turned off.

A display device is provided in at least one embodiment of the present disclosure, which includes the above-mentioned driving circuitry.

In specific implementation, the display device described in at least one embodiment of the present disclosure further includes a touch display panel. For example, the touch display panel may be a TDDI (Touch and Display Driver Integration) panel, but not limited to this.

The display device provided in at least one embodiment of the present disclosure may be any product or component with a display function, such as a mobile phone, a tablet computer, a television, a monitor, a notebook computer, a digital photo frame, and a navigator.

The above embodiments are preferred embodiments of the present disclosure. It should be pointed out that those of ordinary skill in the art can make several improvements and modifications without departing from the principle described in the present disclosure, and these improvements and modifications shall also fall within the protection scope of the present disclosure.

What is claimed is:

1. A driving method, applied to a touch display panel, wherein a shift register unit comprised in a gate driving circuitry in the touch display panel is electrically coupled with a clock signal terminal, the clock signal terminal is used for providing a clock signal to a pull-up circuit in the shift register unit, a display cycle comprises a display time period and a touch time period that are alternately set, and the driving method comprises:

within a period during which initial N rows of gate lines are turned on after entering the display time period from the touch time period in the display cycle, controlling and adjusting the clock signal to increase a falling speed of a potential of a gate drive signal outputted by the shift register unit;

N is a positive integer, wherein a potential of the clock signal is switched between a low potential and a high potential, and the high potential is higher than the low potential; the clock signal terminal is electrically coupled with a voltage control terminal via a switch control circuit, and the switch control circuit is configured to control the voltage control terminal to provide a low voltage signal to the clock signal terminal; and the controlling and adjusting the clock signal comprises:
  when the switch control circuit controls the voltage control terminal to provide the low voltage signal to the clock signal terminal, decreasing a resistance value of the switch control circuit from a first resistance value to a second resistance value.

2. The driving method according to claim 1, wherein a potential of the clock signal is switched between a low potential and a high potential, the high potential is higher than the low potential, and the controlling and adjusting the clock signal comprises:
  when the potential of the clock signal is the low potential, decreasing the potential of the clock signal from a first low potential to a second low potential.

3. The driving method according to claim 2, further comprising:
  after the period during which the N rows of gate lines are turned on has lapsed after entering the display time period from the touch time period in the display cycle, and when the potential of the clock signal is the low potential, controlling the potential of the clock signal to be restored from the second low potential to the first low potential.

4. The driving method according to claim 1, wherein a potential of the clock signal is switched between a low potential and a high potential, the high potential is higher than the low potential, and the controlling and adjusting the clock signal comprises:
  when the potential of the clock signal is the high potential, increasing the potential of the clock signal from a first high potential to a second high potential.

5. The driving method according to claim 4, further comprising:
  after the period during which the N rows of gate lines are turned on has lapsed after entering the display time period from the touch time period in the display cycle, and when the potential of the clock signal is the high potential, controlling the potential of the clock signal to be restored from the second high potential to the first high potential.

6. The driving method according to claim 1, further comprising:
  after the period during which the N rows of gate lines are turned on has lapsed after entering the display time period from the touch time period in the display cycle, and when the switch control circuit controls the voltage control terminal to provide the low voltage signal to the clock signal terminal, restoring the resistance value of the switch control circuit from the second resistance value to the first resistance value.

7. The driving method according to claim 1, wherein within the period during which the initial N rows of gate lines are turned on after entering the display time period from the touch time period in the display cycle, the controlling and adjusting the clock signal comprises: in the display cycle,
  when entering the display time period from the touch time period, setting a count value to 0;
  after entering the display time period from the touch time period, increasing the count value by 1, each time when a period during which one of the N rows of gate lines is turned on has elapsed; and
  when the count value is less than or equal to N, controlling and adjusting the clock signal.

8. The driving method according to claim 1, wherein N is greater than or equal to 2, and is less than or equal to 10.

9. A driving circuitry, applied to a touch display panel, wherein a shift register unit comprised in a gate driving circuitry in the touch display panel is electrically coupled with a clock signal terminal, the clock signal terminal is used for providing a clock signal to a pull-up circuit in the shift register unit, a display cycle comprises a display time period and a touch time period that are alternately set, and the driving circuitry comprises:
  a clock signal adjusting circuit configured to: within a period during which initial N rows of gate lines are turned on after entering the display time period from the touch time period in the display cycle, control and adjust the clock signal to increase a falling speed of a potential of a gate drive signal outputted by the shift register unit;
  N is a positive integer,
  wherein a potential of the clock signal is switched between a low potential and a high potential, and the high potential is higher than the low potential; the driving circuitry further comprises a switch control circuit the clock signal terminal is electrically coupled with a voltage control terminal via the switch control circuit, and the switch control circuit is configured to control the voltage control terminal to provide a low voltage signal to the clock signal terminal; and
  the clock signal adjusting circuit is specifically configured to: decrease a resistance value of the switch control circuit from a first resistance value to a second resistance value, within the period during which the initial N rows of gate lines are turned on after entering the display time period from the touch time period in the display cycle, when the switch control circuit controls the voltage control terminal to provide the low voltage signal to the clock signal terminal.

10. The driving circuitry according to claim 9, wherein a potential of the clock signal is switched between a low potential and a high potential, and the high potential is higher than the low potential; and
  the clock signal adjusting circuit is specifically configured to: decrease the potential of the clock signal from a first low potential to a second low potential, within the period during which the initial N rows of gate lines are turned on after entering the display time period from the touch time period in the display cycle, when the potential of the clock signal is a low potential.

11. The driving circuitry according to claim 10, wherein the clock signal adjusting circuit is further configured to: control the potential of the clock signal to be restored from the second low potential to the first low potential, after the period during which the N rows of gate lines are turned on has lapsed after entering the display time period from the touch time period in the display cycle, and when the potential of the clock signal is the low potential.

12. The driving circuitry according to claim 9, wherein a potential of the clock signal is switched between a low potential and a high potential, and the high potential is higher than the low potential; and
  the clock signal adjusting circuit is specifically configured to: increase the potential of the clock signal from a first high potential to a second high potential, within the period during which the initial N rows of gate lines are turned on after entering the display time period from the touch time period in the display cycle, when the potential of the clock signal is the high potential.

13. The driving circuitry according to claim 12, wherein the clock signal adjusting circuit is further configured to: control the potential of the clock signal to be restored from the second high potential to the first high potential, after the period during which the N rows of gate lines are turned on has lapsed after entering the display time period from the touch time period in the display cycle, and when the potential of the clock signal is the high potential.

14. The driving circuitry according to claim 9, wherein the clock signal adjusting circuit is further configured to: restore the resistance value of the switch control circuit from the second resistance value to the first resistance value, after the period during which the N rows of gate lines are turned on has elapsed after entering the display time period from the touch time period in the display cycle, and when the switch control circuit controls the voltage control terminal to provide the low voltage signal to the clock signal terminal.

15. The driving circuitry according to claim 9, wherein the switch control circuit comprises M switch control transistors, M being greater than 1;
- a control electrode of an m-th switch control transistor is electrically coupled with an m-th switch control terminal, a first electrode of the m-th switch control transistor is electrically coupled with the clock signal terminal, and a second electrode of the m-th switch control transistor is electrically coupled with the voltage control terminal; m is a positive integer less than or equal to M; and
- the clock signal adjusting circuit is configured to: control at least two of the M switch control transistors to be turned on, within the period during which the initial N rows of gate lines are turned on after entering the display time period from the touch time period in the display cycle, when the switch control circuit controls the voltage control terminal to provide the low voltage signal to the clock signal terminal.

16. The driving circuitry according to claim 15, wherein the clock signal adjusting circuit is further configured to: control a switch control transistor of the M switch control transistors to be turned on, and other switch control transistors among the M switch control transistors except the switch control transistor to be turned off, after the period during which the N rows of gate lines are turned on has elapsed after entering the display time period from the touch time period in the display cycle, and when the switch control circuit controls the voltage control terminal to provide the low voltage signal to the clock signal terminal.

17. The driving circuitry according to claim 9, wherein N is greater than or equal to 2, and is less than or equal to 10.

18. A display device comprising the driving circuitry according to claim 9.

19. A driving method, applied to a touch display panel, wherein a shift register unit comprised in a gate driving circuitry in the touch display panel is electrically coupled with a clock signal terminal, the clock signal terminal is used for providing a clock signal to a pull-up circuit in the shift register unit, a display cycle comprises a display time period and a touch time period that are alternately set, and the driving method comprises:
- within a period during which initial N rows of gate lines are turned on after entering the display time period from the touch time period in the display cycle, controlling and adjusting the clock signal to increase a falling speed of a potential of a gate drive signal outputted by the shift register unit;
- N is a positive integer,
- wherein within the period during which the initial N rows of gate lines are turned on after entering the display time period from the touch time period in the display cycle, the controlling and adjusting the clock signal comprises: in the display cycle,
- when entering the display time period from the touch time period, setting a count value to 0;
- after entering the display time period from the touch time period, increasing the count value by 1, each time when a period during which one of the N rows of gate lines is turned on has elapsed; and
- when the count value is less than or equal to N, controlling and adjusting the clock signal.

\* \* \* \* \*